United States Patent [19]
Liu

[11] Patent Number: 6,015,751
[45] Date of Patent: Jan. 18, 2000

[54] SELF-ALIGNED CONNECTION TO UNDERLAYER METAL LINES THROUGH UNLANDED VIA HOLES

[75] Inventor: Meng-Chang Liu, Chia-yi, Taiwan

[73] Assignee: Taiwan Semiconductor Manufacturing Company, Hsin-chu, Taiwan

[21] Appl. No.: 09/055,438

[22] Filed: Apr. 6, 1998

[51] Int. Cl.[7] .............................................. H01L 21/4763
[52] U.S. Cl. ........................ 438/637; 438/624; 438/639; 438/666; 438/668; 438/675
[58] Field of Search ................................ 438/624, 637, 438/639, 666, 668, 675

[56] References Cited

U.S. PATENT DOCUMENTS

| | | | |
|---|---|---|---|
| 4,767,724 | 8/1988 | Kim et al. | 437/194 |
| 5,166,096 | 11/1992 | Cote et al. | 438/586 |
| 5,268,330 | 12/1993 | Givens et al. | 438/586 |
| 5,317,192 | 5/1994 | Chen et al. | 257/750 |
| 5,321,211 | 6/1994 | Haslam et al. | 174/262 |
| 5,350,712 | 9/1994 | Shibata | 438/629 |
| 5,409,861 | 4/1995 | Choi | 438/644 |
| 5,451,543 | 9/1995 | Woo et al. | 437/195 |
| 5,462,893 | 10/1995 | Matsuoka et al. | 437/195 |
| 5,619,072 | 4/1997 | Mehta | 257/774 |
| 5,656,543 | 8/1997 | Chung | 438/625 |
| 5,700,737 | 12/1997 | Yu et al. | 438/636 |
| 5,702,568 | 12/1997 | Shin et al. | 156/644.1 |
| 5,702,981 | 12/1997 | Maniar et al. | 438/627 |
| 5,731,236 | 3/1998 | Chou et al. | 438/253 |
| 5,756,396 | 5/1998 | Lee et al. | 438/622 |
| 5,811,350 | 9/1998 | Dennison | 438/597 |
| 5,827,778 | 10/1998 | Yamada et al. | 438/637 |
| 5,872,056 | 2/1999 | Manning | 438/637 |
| 5,899,722 | 5/1999 | Huang | 438/305 |
| 5,916,823 | 6/1999 | Lou et al. | 438/738 |
| 5,930,664 | 7/1999 | Hsu et al. | 438/612 |
| 5,933,755 | 8/1999 | Lee | 438/634 |

OTHER PUBLICATIONS

C.Y. Chang & S.M. Sze, "VLSI Technology", McGraw–Hill Companies, Inc. 1996, pp. 446–447.

*Primary Examiner*—John F. Niebling
*Assistant Examiner*—Lynne A. Gurley
*Attorney, Agent, or Firm*—George O. Saile; Stephen B. Ackerman; Larry J. Prescott

[57] ABSTRACT

Methods for forming via holes in inter-level dielectric layers for via connections to underlying electrodes are described. The underlying electrodes do not have electrode pads or enlarged areas of the electrode to contact the conductive material in the via hole. The method avoids the problems of oversize vias and mis-aligned vias. One of the embodiments uses extra wide dielectric spacers formed in two steps on the sidewalls of the underlying electrodes. The spacers provide an effective electrode width greater than the actual width of the electrode thereby increasing the tolerance for both the size and the alignment of the via holes. Another embodiment uses alternate layers of two dielectric materials and etching methods which etch each of the two materials selectively. The dielectric material which is not etched in each step serves as an etch stop layer.

19 Claims, 9 Drawing Sheets

FIG. 20 ured circuit wafer 8.

SELF-ALIGNED CONNECTION TO UNDERLAYER METAL LINES THROUGH UNLANDED VIA HOLES

BACKGROUND OF THE INVENTION

(1) Field of the Invention

This invention relates to the formation of unlanded via holes through an inter-level dielectric layer for connection to underlying electrodes, and more specifically to methods of avoiding problems caused by oversize and mis-aligned via holes.

(2) Description of the Related Art

U.S. Pat. No. 5,451,543 to Woo et al. describes a method of forming contact via holes which allows the fabrication of unlanded vias having a substantially vertical sidewall profile. The method uses an etch stop layer.

U.S. Pat. No. 5,321,211 to Haslam et al. describes a method for forming contact vias in integrated circuits. The method describes the use of a single spacer on the electrode sidewalls.

U.S. Pat. No. 4,767,724 to Kim et al. describes a method which uses etch stops in the fabrication of unframed or borderless via openings.

U.S. Pat. No. 5,656,543 to Chung describes a method of forming borderless vias for interconnecting layers in a semiconductor device using a protective layer on the top of the underlying electrodes. An etch stop layer is used in forming the vias.

U.S. Pat. No. 5,317,192 to Chen et al. describes a method of forming a via hole using an amorphous silicon or oxide barrier layer on the sidewalls of the via hole.

U.S. Pat. No. 5,462,893 to Matsuoka et al. describes the use of an amorphous silicon layer as an etch stop layer.

U.S. Pat. No. 5,619,072 to Mehta describes a method of forming a multi-level semiconductor device with conducting vias utilizing an etch stop insulating material.

Stacked contacts and borderless contacts are discussed in the book "ULSI Technology", by C. Y. Chang and S. M. Sze, The McGraw-Hill Companies, Inc., 1996, pages 446–447.

SUMMARY OF THE INVENTION

Multiple layers of wiring are necessary to fully utilize the capability of integrated circuit chips. In the formation of multiple layers of wiring a first layer of electrodes is separated from a second layer of electrodes by a layer of inter-metal dielectric. Via holes are formed in the inter-metal dielectric and filled with metal, or other conducting material, to provide the interconnection from the first layer of electrodes to the second layer of electrodes. Proper alignment among the first layer of electrodes, the via holes, and the second layer of electrodes is required to form good connections.

Figure 1A:
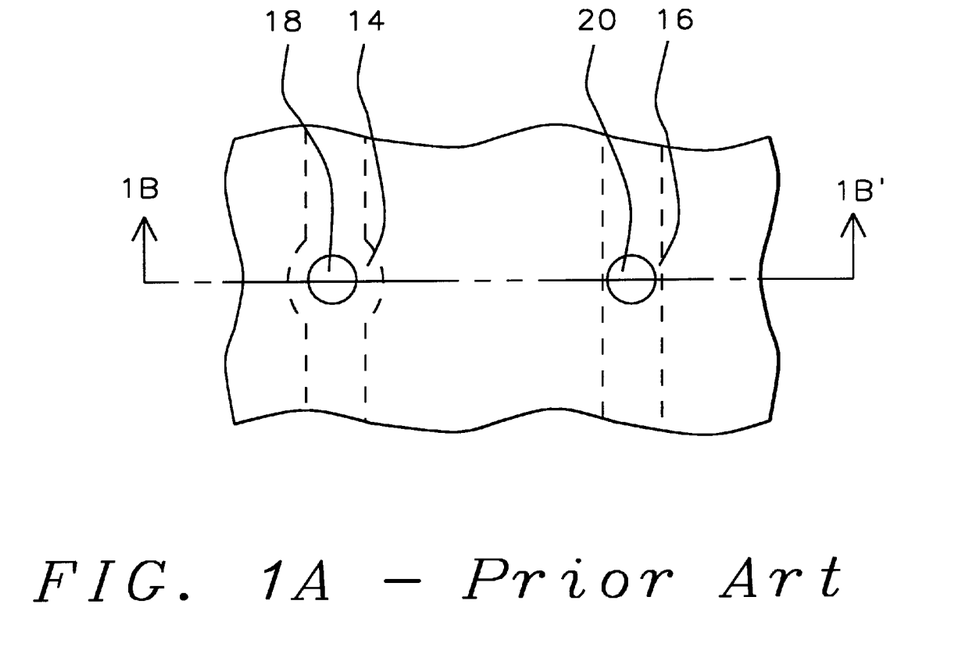
FIG. 1A shows top view of a part of an integrated circuit wafer having perfectly aligned via holes over an electrode having an electrode pad and an electrode without an electrode pad.
Figure 1B:
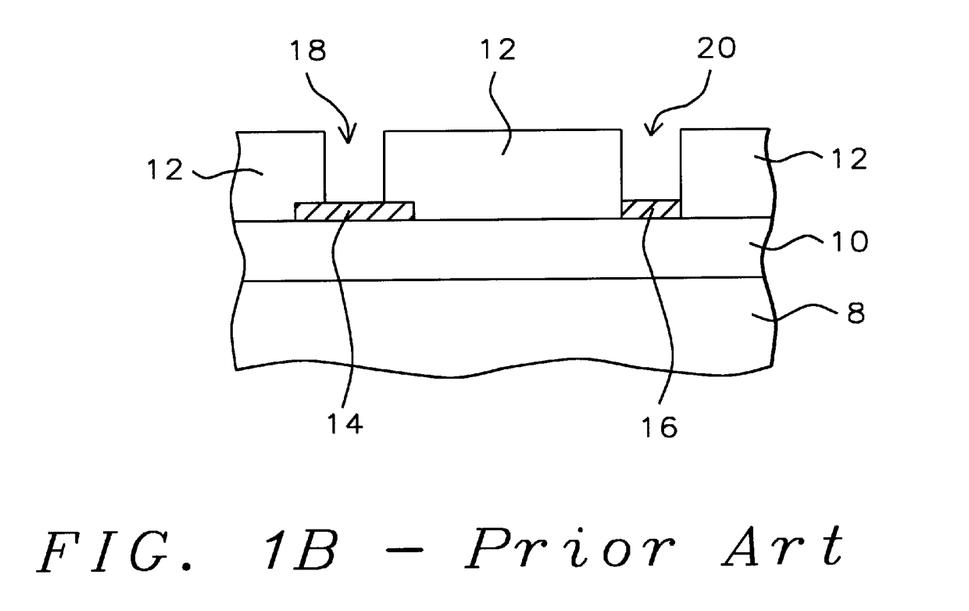
FIG. 1B shows a cross section view of the part of the integrated circuit wafer of FIG. 1A taken along line 1B-1B' of FIG. 1A.
Figure 1C:
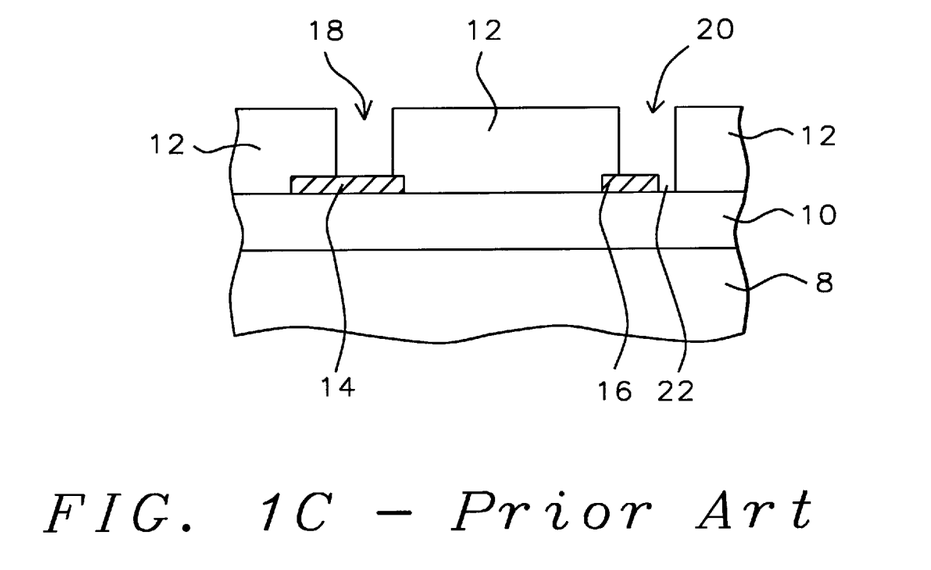
FIG. 1C shows a cross section view of a part of an integrated circuit wafer having mis-aligned via holes over an electrode having an electrode pad and an electrode without an electrode pad.

It has been common practice to use an electrode pad larger than the via hole on the first layer of electrodes to accommodate any mis-alignment between the via hole and the first layer of electrodes. With increasing wiring density requirements, however the electrode pads have been eliminated. Contact material in via holes having a diameter about equal to the electrode width contact electrodes without any change to the electrode shape. FIG. 1A shows a top view of a part of an integrated circuit wafer. FIG. 1B a cross section view of the part of the integrated circuit wafer of FIG. 1A taken along line 1B-1B' of FIG. 1A. FIGS. 1A and 1B show the case of a via hole 18 in a layer of inter-metal dielectric 12 formed over an electrode pad 14 and a via hole 20 formed over an electrode 16 with no electrode pad for the case of perfect alignment of the via holes to the electrode pattern. FIG. 1C illustrates the problems caused by the case of the via hole 18 in a layer of inter-metal dielectric 12 formed over an electrode pad 14 and the via hole 20 formed over an electrode 16 with no electrode pad with a small mis-alignment between the via holes and the electrode pattern. As can be seen in FIG. 1C in the case of the electrode pad 14 the mis-alignment is not a problem but in the case of no electrode pad part of the via hole 20 misses the electrode 16, resulting in an unlanded via with a gap 22 next to the electrode 16. The gap 22 can trap impurities which can lead to later processing or reliability problems. As shown in FIGS. 1B and 1C the electrodes are formed on a layer of dielectric 10 which is formed on an integrated circuit wafer 8.

Figure 2A:
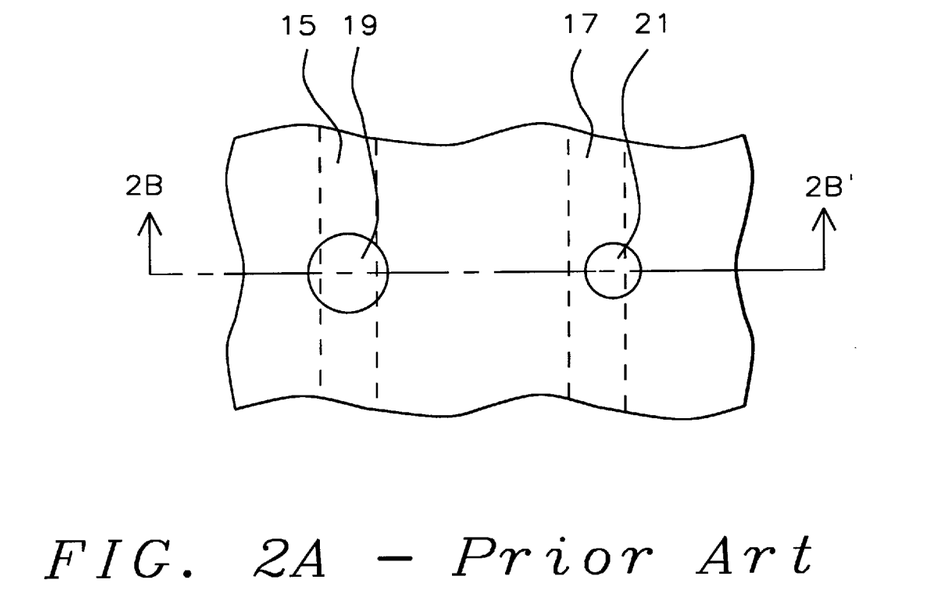
FIG. 2A shows a top view of a part of an integrated circuit wafer having over sized and mis-aligned via holes over electrodes without electrode pads.
Figure 2B:
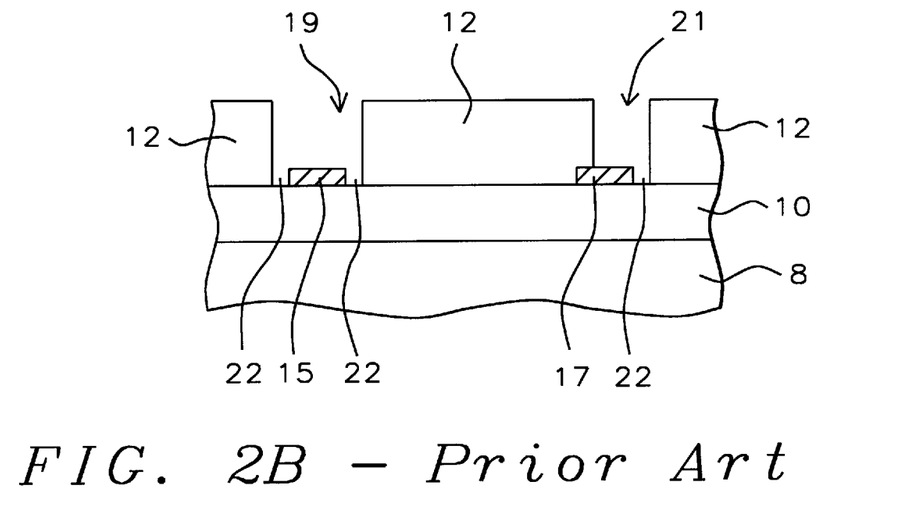
FIG. 2B shows a cross section view of the part of an integrated circuit wafer of FIG. 2A taken along line 2B-2B' of FIG. 2A.

FIGS. 2A and 2B show problems which can occur when the electrode pad is eliminated and the vias are formed directly over the electrodes. FIG. 2A shows a top view and FIG. 2B a cross section view of a part of an integrated circuit wafer showing an oversized via hole 19 in a layer of inter-metal dielectric 12 over an electrode 15 with no electrode pad and a mis-aligned via hole in a layer of inter-metal dielectric 21 over an electrode 17 with no electrode pad. As seen in FIG. 2B the case of the oversize via hole 19 and the case of the mis-aligned via hole 21 both result in gaps 22 at the edge of the electrodes, 15 and 17. These gaps can trap impurities and lead to processing and reliability problems. As shown in FIG. 2B the electrodes are formed on a layer of dielectric 10 which is formed on an integrated circuit wafer 8.

It is a principle objective of this invention to provide a method of forming via connections between an electrode having no electrode pad and a via hole formed in a layer of inter-metal dielectric and filled with a conductor which avoids problems due to mis-aligned via holes or oversized via holes.

In one embodiment this objective is achieved by forming extra wide dielectric spacers in two steps on the sidewalls of the electrodes. The via holes are etched in the inter-metal dielectric. The dielectric used to form the extra wide spacers, the inter-metal dielectric, and the etching means used to etch the via holes are chosen so that the etching rate of the inter-metal dielectric is much grater than the etching rate of the dielectric used to form the extra wide spacers. The extra wide spacers have the effect of providing a wider electrode to which the via hole is aligned.

In another embodiment this objective is achieved by forming a dielectric cap on the electrodes and a conformal dielectric layer over the electrodes with the dielectric cap. The inter-metal dielectric is then formed over the conformal dielectric layer. The via hole is etched in the inter-metal dielectric using an etching means chosen so that the etching rate of the inter-metal dielectric is much greater than the etching rate of the dielectric used to form the conformal dielectric layer so that the conformal dielectric layer acts as an etch stop. That part of the conformal dielectric layer at the bottom of the via hole in the inter-level dielectric layer is then etched away using an etching means chosen so that the etching rate of the dielectric used to form the conformal dielectric layer is much greater than the etching rate of the dielectric used to form the dielectric cap or the dielectric used to form the inter-metal dielectric layer so that the dielectric cap and the inter-metal dielectric layer act as an etch stop. That part of the dielectric cap at the bottom of the via hole in the inter-level dielectric layer is then etched away using an etching means chosen so that the etching rate of the dielectric used to form the dielectric cap is much greater than the etching rate of the dielectric used to form the conformal dielectric layer. The conformal dielectric layer on the sidewalls of the electrodes have the effect of providing a wider electrode to which the via hole is aligned.

DESCRIPTION OF THE PREFERRED EMBODIMENTS

Figure 3:
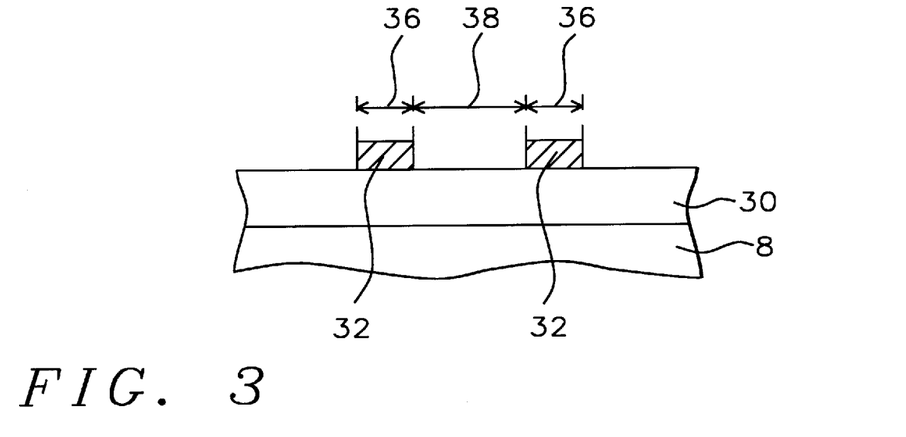
FIG. 3 shows a cross section view of a part of an integrated circuit wafer showing electrodes formed on a layer of first dielectric.

Refer now to FIGS. 3–9 for a description of a preferred embodiment of the method of forming via connections of this invention. FIG. 3 shows a cross section view of a part of an integrated circuit wafer 8 having a layer of first dielectric 30 formed thereon and devices formed therein, not shown. Electrodes 32 are formed on the layer of first dielectric material 30 of a conducting material such as polysilicon, aluminum or the like. The layer of first dielectric in this example is a silicon oxide. The electrodes 32 have a width 36 of between about 0.25 and 0.50 micrometers and a have a spacing 38 between the electrodes of between about 0.35 and 0.75 micrometers.

Figure 4:
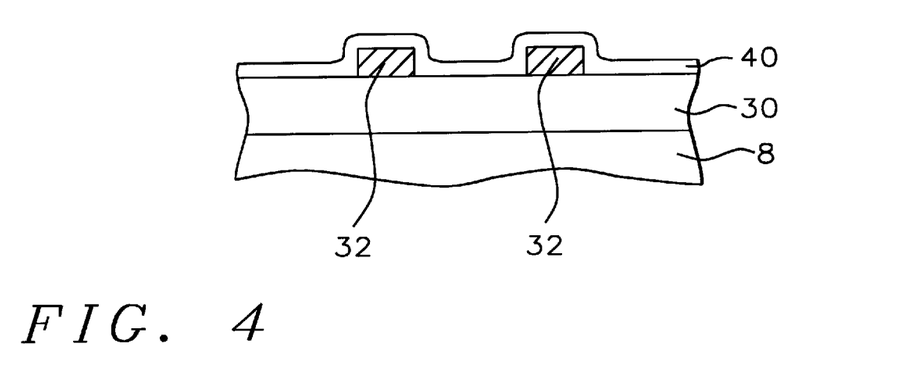
FIG. 4 shows a cross section view of the part of the integrated circuit wafer of FIG. 3 after forming a first layer of second dielectric over the electrodes.
Figure 5:
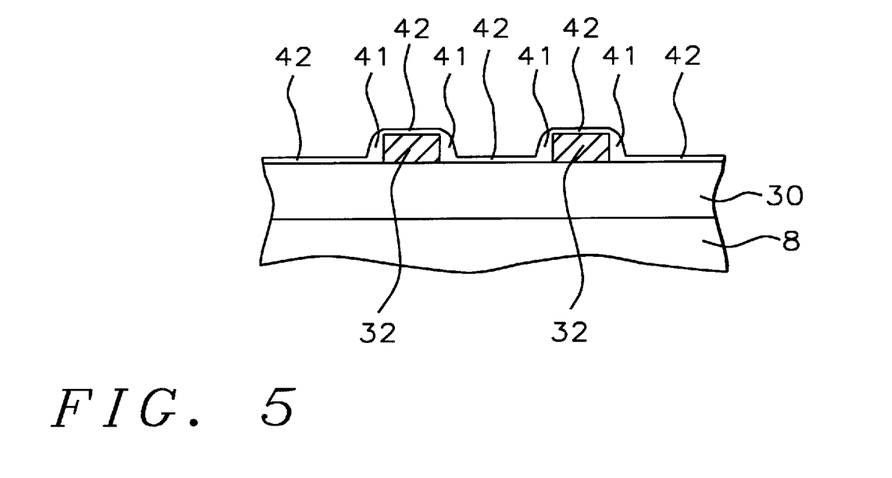
FIG. 5 shows a cross section view of the part of the integrated circuit wafer of FIG. 3 after first spacers of second dielectric have been formed on the sidewalls of the electrodes.

As shown in FIG. 4 a first layer of second dielectric material 40 is then formed on the wafer covering the electrodes 32. The second dielectric material is a material such as silicon nitride or silicon oxynitride, in this example silicon nitride having a thickness of between about 300 and 3000 Angstroms. As shown in FIG. 5 the first layer of second dielectric is then etched back using dry anisotropic etching using etchants such as $CF_4$, $CHF_3$, $SF_6$, Ar, or $N_2$, thereby forming first spacers 41 of second dielectric material on the sidewalls of the electrodes 32. In the etchback used to form the first spacers 41, all of the second dielectric may be removed from the top of the electrodes and the spaces between the electrodes or some of the second dielectric 42 may be left on the top of the electrodes and in the spaces between the electrodes as shown by reference number 42 in FIG. 5.

Figure 6:
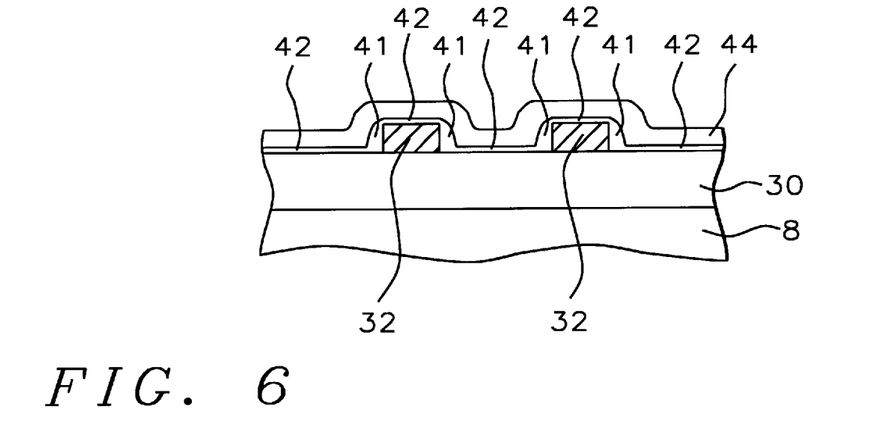
FIG. 6 shows a cross section view of the part of the integrated circuit wafer of FIG. 3 after forming a second layer of second dielectric over the electrodes and first spacers of second dielectric.
Figure 7:
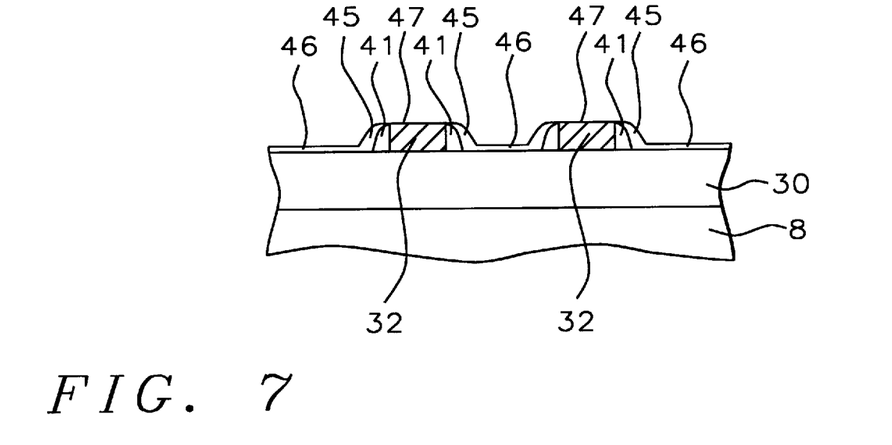
FIG. 7 shows a cross section view of the part of the integrated circuit wafer of FIG. 3 after second spacers of second dielectric have been formed on the first spacers of second dielectric.

Next, as shown in FIG. 6, a second layer 44 of second dielectric is formed on the wafer covering the electrodes and the remaining part of the first layer of second dielectric. In this example the second layer of second dielectric is a layer of silicon nitride or silicon oxynitride having a thickness of between about 300 and 3000 Angstroms. As shown in FIG. 7, the second layer of second dielectric is then etched back using dry anisotropic etching with etchants such as $CF_4$, $CHF_3$, $SF_6$, Ar, or $N_2$, thereby forming second spacers 45 of second dielectric formed on the first spacers 41 of second dielectric. In this etchback all of the second dielectric is removed from the top 47 of the electrodes. All of the second dielectric may also be removed from the spaces between the electrodes or a small amount of second dielectric 46 may be left in the spaces between the electrodes, as shown by reference number 46 in FIG. 7. The combined first spacers 41 and second spacers 45 provide an extra width of between about 0.1 and 0.35 micrometers for the electrodes 32.

Figure 8:
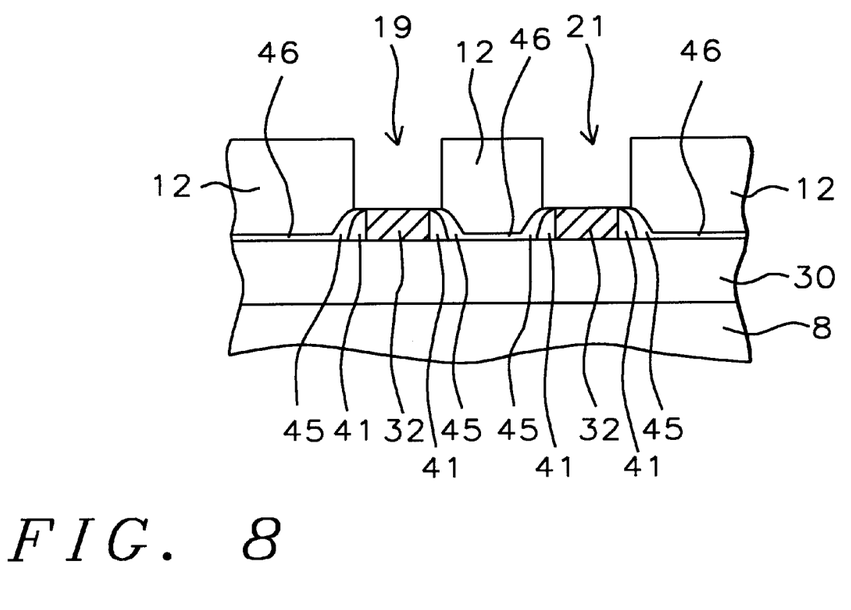
FIG. 8 shows a cross section view of the part of the integrated circuit wafer of FIG. 7 after forming via holes in a layer of third dielectric.
Figure 9:
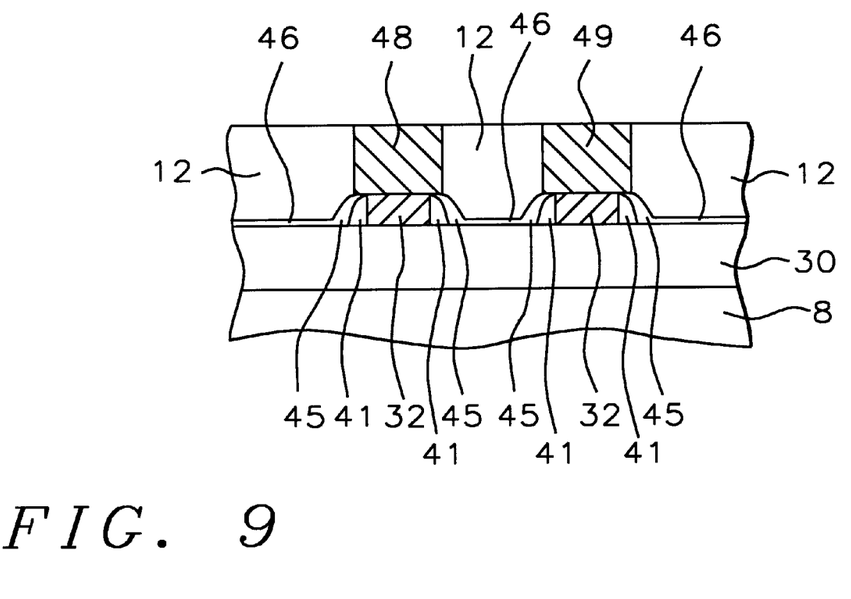
FIG. 9 shows a cross section view of the part of the integrated circuit wafer of FIG. 8 after filling the via holes in the layer of third dielectric with conducting material.

Next, as shown in FIG. 8, a layer of third dielectric 12 is formed on the wafer and via holes, 19 and 21, are etched in the layer of third dielectric using dry anisotropic etching. The layer of third dielectric 12 is the inter-metal dielectric. In this example the third dielectric is a silicon oxide having a thickness of between about 6000 and 25,000 Angstroms. In the etching of the via holes, 19 and 21, the second dielectric, the third dielectric, and the etching method must be chosen so that the etching rate of the third dielectric is about ten times larger than the etching rate of the second dielectric. In this example with silicon nitride as the second dielectric and silicon oxide as the third dielectric the via holes are etched using dry anisotropic etching with etchants such as $CF_4$, $CHF_3$, Ar, or $N_2$. FIG. 8 shows an example of an oversize via hole 19 and a mis-aligned via hole 21. The extra width provided by the first spacers 41 and second spacers 45 provide a tolerance of between about 0.1 and 0.35 micrometers for the alignment of, or the diameter of, the via holes. As shown in FIG. 9, the via holes are then filled with a second conducting material, 48 and 49, such as tungsten, aluminum, copper or the like. Normal processing of the wafer then continues.

Figure 10:
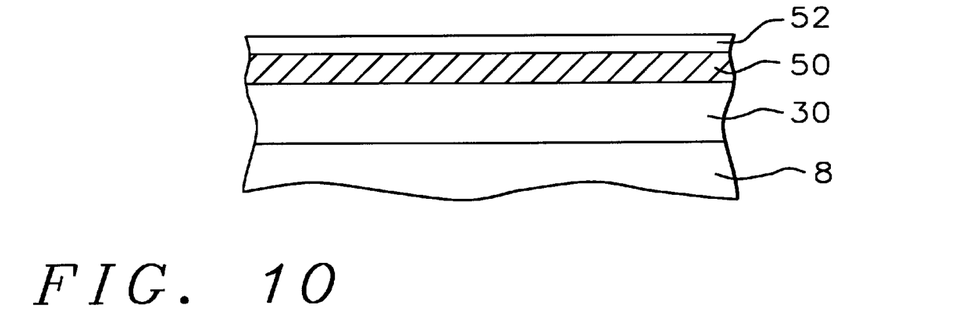
FIG. 10 shows a cross section view of a part of an integrated circuit wafer having a layer of first dielectric, a layer of conductor material, and a layer of second dielectric formed thereon.
Figure 11:
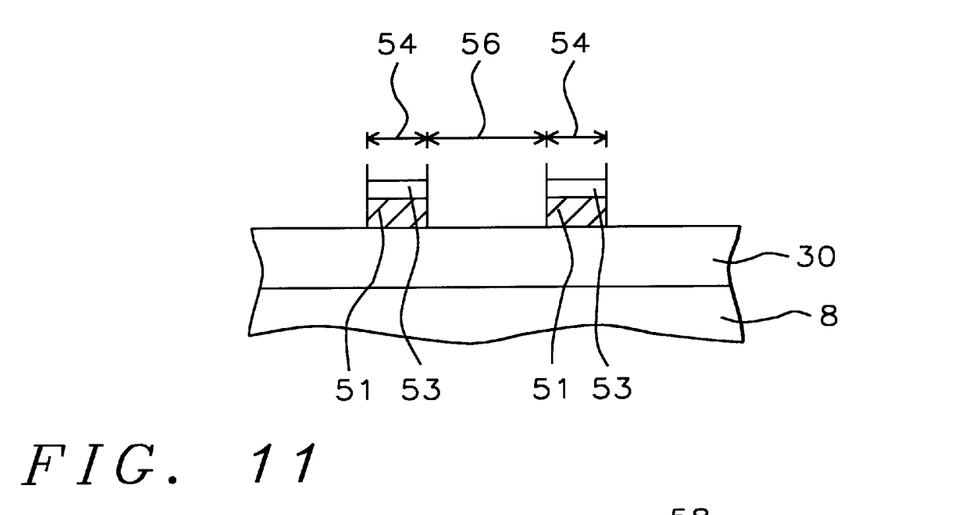
FIG. 11 shows a cross section view of the part of an integrated circuit wafer of FIG. 10 after the layer of first conductor material and the layer of second dielectric material have been patterned.

Refer now to FIGS. 10–17 for another embodiment of the method of forming via connections of this invention. FIG. 10 shows a cross section view of a part of an integrated circuit wafer 8 having a layer of first dielectric 30 formed thereon and devices formed therein, not shown. A layer of first conducting material 50 is formed on the layer of first dielectric 30 and a layer of second dielectric material 52 is formed on the layer of first conducting material 50. In this example the first dielectric 30 is a silicon oxide and the first conducting material is polysilicon, aluminum, or the like. The layer of second dielectric material 52 is a layer of a silicon oxide having a thickness of between about 300 and 2000 Angstroms. As shown in FIG. 11 the layer of second dielectric and the layer of first conducting material are patterned to an electrode pattern forming electrodes 51 with a second dielectric cap 53 on each of the electrodes 51. The electrodes 51 have a width 54 of between about 0.25 and 0.50 micrometers and a have a spacing 56 between the electrodes of between about 0.35 and 0.75 micrometers.

Figure 12:
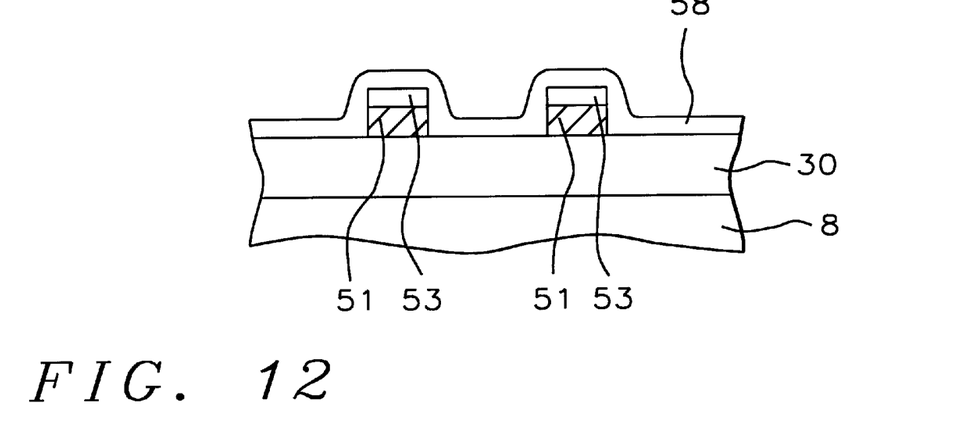
FIG. 12 shows a cross section view of the part of an integrated circuit wafer of FIG. 11 after a layer of third dielectric material has been deposited on the patterned layer of conductor material and patterned layer of second dielectric material.
Figure 13:
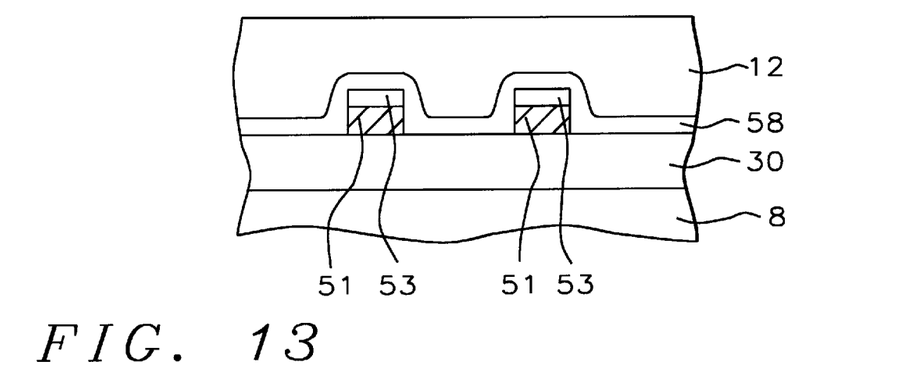
FIG. 13 shows a cross section view of the part of an integrated circuit wafer of FIG. 12 after a layer of fourth dielectric material has been deposited on the layer of third dielectric material.

Next, as shown in FIG. 12, a layer of third dielectric 58 is formed on the wafer covering the electrodes 51 and the second dielectric caps 53. In this example the layer of third dielectric is a layer of silicon nitride or silicon oxynitride having a thickness of between about 300 and 3000 Angstroms. Next, as shown in FIG. 13, a layer of fourth dielectric 12 is formed over the layer of third dielectric 58. In this example the fourth dielectric is a silicon oxide having a thickness of between about 6000 and 25,000 Angstroms. The fourth dielectric is the inter-metal dielectric.

Figure 14:
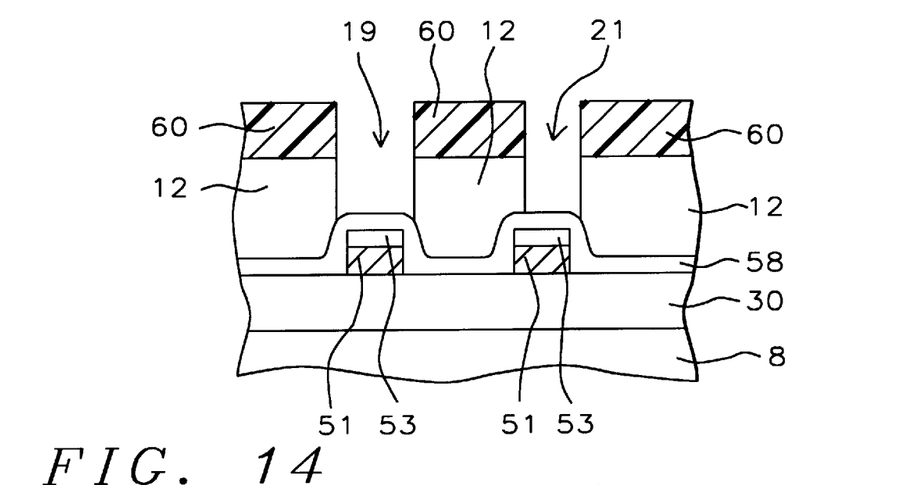
FIG. 14 shows a cross section view of the part of an integrated circuit wafer of FIG. 13 after via holes have been formed in the layer of fourth dielectric material.

As shown in FIG. 14 a layer of photoresist 60 is then formed on the layer of fourth dielectric 12 and patterned to form a mask for forming via holes, 19 and 21, in the layer of fourth dielectric 12. Via holes, 19 and 21 are then etched in the layer of fourth dielectric 12 using the layer of third dielectric as an etch stop. One of the via holes, reference number 19, represents an oversized via hole and one of the via holes, reference number 21, represents a mis-aligned via hole. The photoresist is then stripped. The third dielectric, fourth dielectric, and etching method are chosen so that the etching rate of the fourth dielectric is at least ten times greater than the etching rate of the third dielectric. In this example the third dielectric is silicon nitride, the fourth dielectric is a silicon oxide, the etching uses dry anisotropic etching and etchants such as $CF_4$, $CHF_3$, Ar, or $N_2$.

Figure 15:
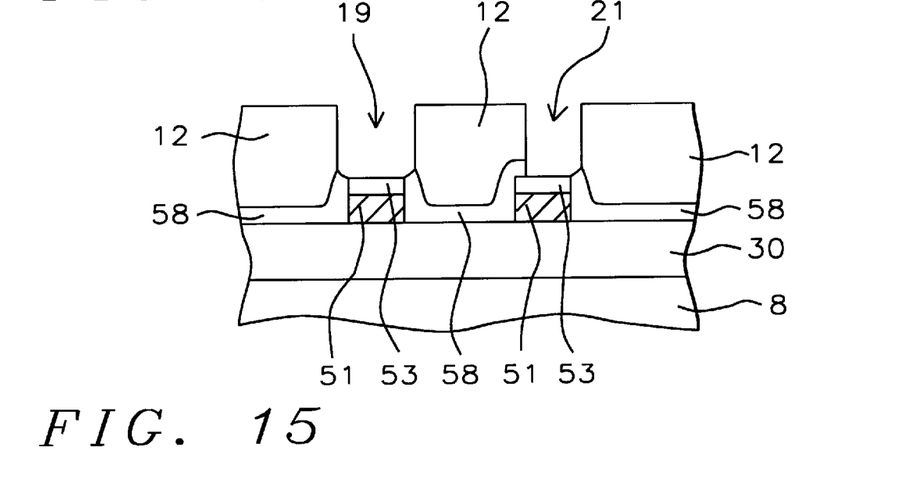
FIG. 15 shows a cross section view of the part of an integrated circuit wafer of FIG. 14 after that part of the third dielectric layer at the bottom of the via holes formed in the layer of fourth dielectric material has been etched away.

Next, as shown in FIG. 15, that part of the layer of third dielectric 58 at the bottom of the via holes, 19 and 21, are etched away using the second dielectric cap 53 as an etch stop. The second dielectric, third dielectric, fourth dielectric, and etching method are chosen so that the etching rate of the third dielectric is at least ten times greater than either the etching rate of the fourth dielectric or the etching rate of the second dielectric. In this example the third dielectric is silicon nitride, the second and fourth dielectrics are silicon oxide, and the etching is accomplished using dry anisotropic etching and etchants such as $CF_4$, $CHF_3$, $SF_6$, Ar, or $N_2$. As indicated previously, one of the via holes, reference number 19, represents an oversized via hole and one of the via holes, reference number 21, represents a mis-aligned via hole.

Figure 16:
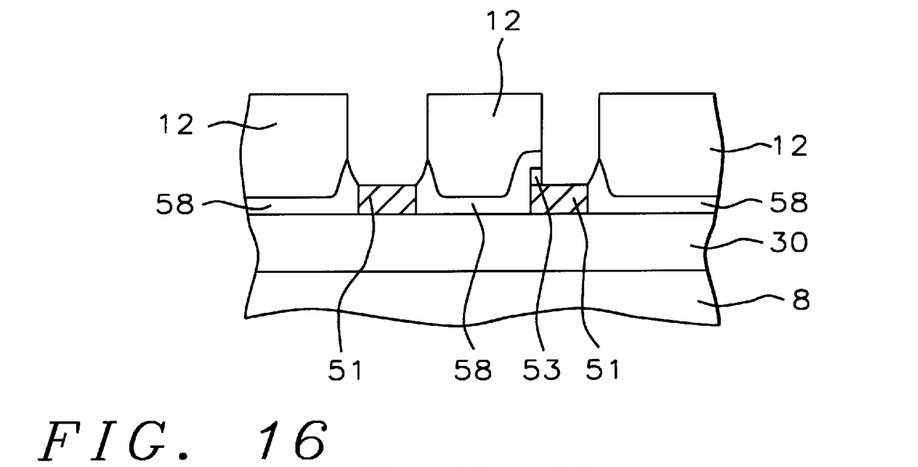
FIG. 16 shows a cross section view of the part of an integrated circuit wafer of FIG. 15 after that part of the second dielectric layer at the bottom of the via holes formed in the layer of fourth dielectric material has been etched away.
Figure 17:
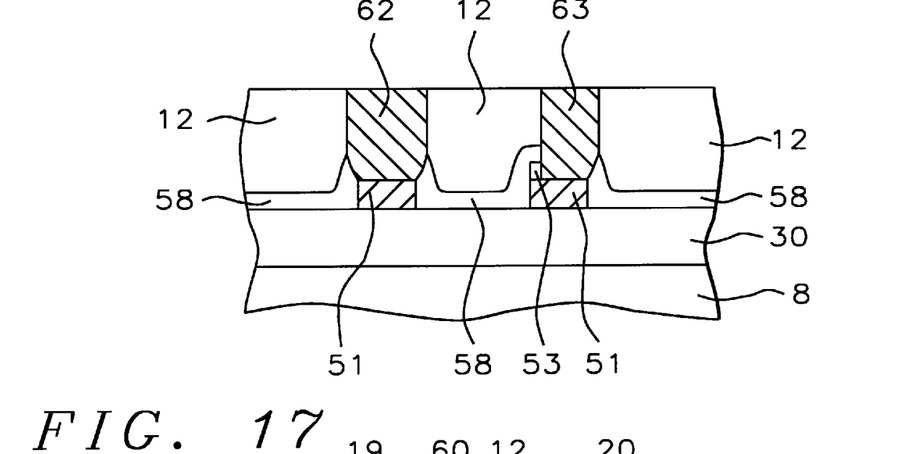
FIG. 17 shows a cross section view of the part of an integrated circuit wafer of FIG. 16 after the via holes formed in the layer of fourth dielectric material have been filled with second conducting material.

Next, as shown in FIG. 16, that part of the second dielectric cap at the bottom of the via holes is etched away. The second dielectric, third dielectric, and etching method are chosen so that the etching rate of the second dielectric is at least ten times greater than the etching rate of the third dielectric. In this example the second dielectric is a silicon oxide, the third dielectric is silicon nitride or silicon oxynitride, and the etching is accomplished using dry anisotropic etching and etchants such as $CF_4$, $CHF_3$, Ar, or $N_2$. As shown in FIG. 16, a part of the second dielectric cap 53 is left in place due to the misaligned via. Next, as shown in FIG. 17, the via holes are filled with a second conducting material, 62 and 63, such as tungsten, aluminum, copper or the like. Normal processing of the wafer then continues.

Figure 18:
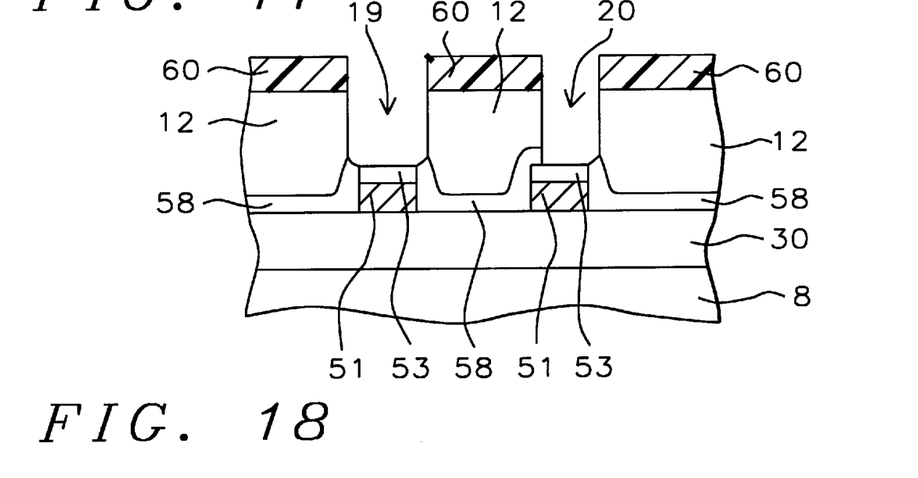
FIG. 18 shows a cross section view of the part of an integrated circuit wafer of FIG. 14 after that part of the third dielectric layer at the bottom of the via holes formed in the layer of fourth dielectric material has been etched away.

An alternative embodiment is shown in FIGS. 3–14 and 18–20. This embodiment proceeds exactly the same as the preceding embodiment through the step of etching via holes, 19 and 21, in the layer of fourth dielectric 12 using the layer of third dielectric as an etch stop, see FIG. 14. One of the via holes, reference number 19, represents an oversized via hole and one of the via holes, reference number 21, represents a mis-aligned via hole. In this embodiment the photoresist 60 is left in place. The third dielectric, fourth dielectric, and etching method are chosen so that the etching rate of the fourth dielectric is at least ten times greater than the etching rate of the third dielectric. In this example the third dielectric is silicon nitride, the fourth dielectric is a silicon oxide, the etching uses dry anisotropic etching and etchants such as $CF_4$, $CHF_3$, Ar, or $N_2$ Next, as shown in FIG. 18, that part of the layer of third dielectric 58 at the bottom of the via holes, 19 and 21, are etched away using the second dielectric cap 53 as an etch stop. The second dielectric, third dielectric, and etching method are chosen so that the etching rate of the third dielectric is at least ten times greater than the etching rate of the second dielectric. In this example the third dielectric is silicon nitride, the second and fourth dielectrics are silicon oxide, and the etching is accomplished using dry anisotropic etching and etchants such as $CF_4$, $CHF_3$, $SF_6$, Ar, or $N_2$. As indicated previously, one of the via holes, reference number 19, represents an oversized via hole and one of the via holes, reference number 21, represents a misaligned via hole.

Figure 19:
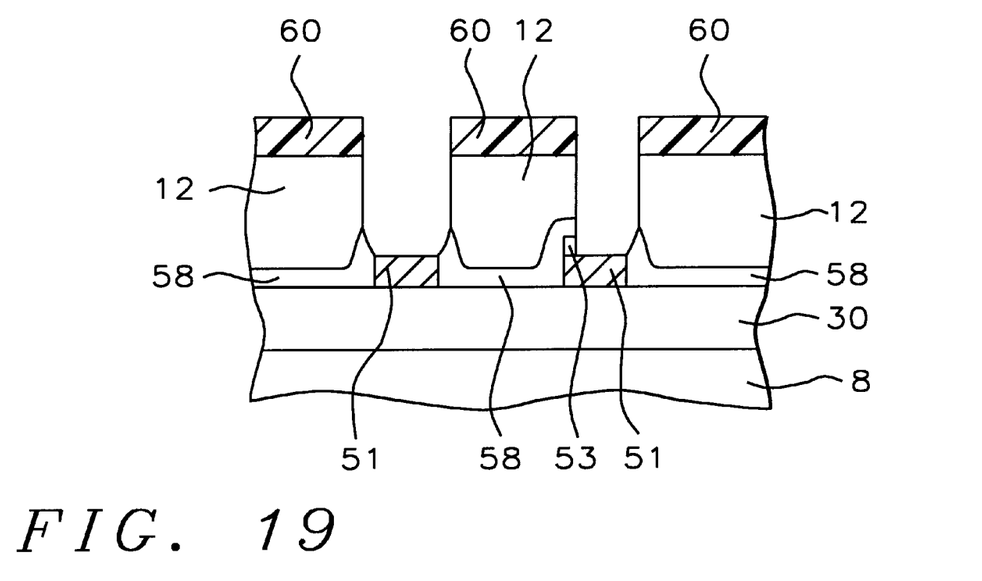
FIG. 19 shows a cross section view of the part of an integrated circuit wafer of FIG. 18 after that part of the second dielectric layer at the bottom of the via holes formed in the layer of fourth dielectric material has been etched away.
Figure 20:
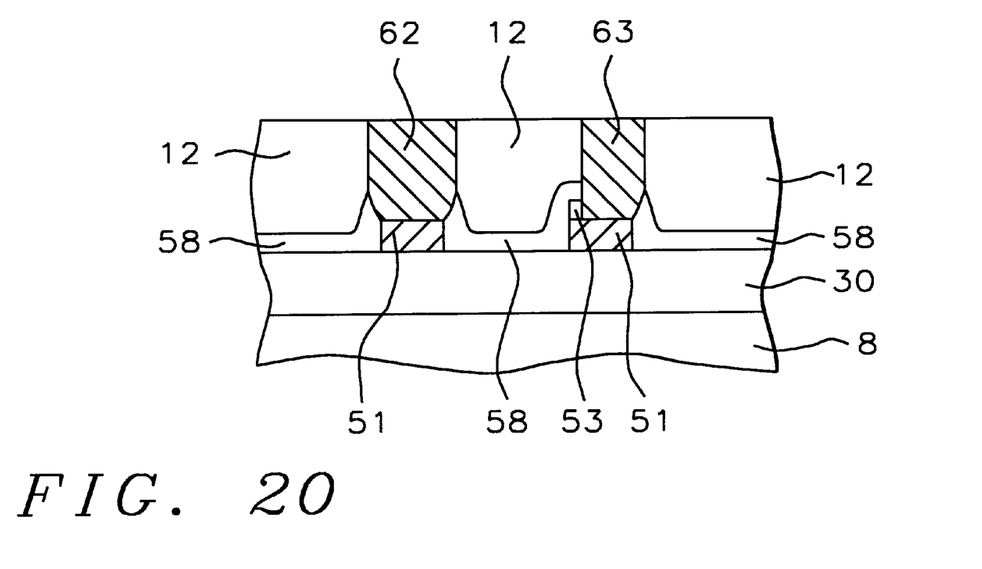
FIG. 20 shows a cross section view of the part of an integrated circuit wafer of FIG. 19 after the via holes formed in the layer of fourth dielectric material have been filled with second conducting material.

Next, as shown in FIG. 19, that part of the second dielectric cap at the bottom of the via holes is etched away. The second dielectric, third dielectric, and etching method are chosen so that the etching rate of the second dielectric is at least ten times greater than the etching rate of the third dielectric. In this example the second dielectric is a silicon oxide, the third dielectric is silicon nitride or silicon oxynitride, and the etching is accomplished using dry anisotropic etching and etchants such as $CF_4$, $CHF_3$, Ar, or $N_2$. As shown in FIG. 19, a part of the second dielectric cap 53 is left in place due to the misaligned via. The layer photoresist 60 is then stripped. Next, as shown in FIG. 20, the via holes are filled with a second conducting material, 62 and 63, such as tungsten, aluminum, copper or the like. Normal processing of the wafer then continues.

While the invention has been particularly shown and described with reference to the preferred embodiments thereof, it will be understood by those skilled in the art that various changes in form and details may be made without departing from the spirit and scope of the invention.

What is claimed is:

1. A method of forming via connections, comprising the steps of:
   providing a substrate having a layer of first dielectric formed thereon;
   forming electrodes from a first conducting material, each said electrode having a top surface and sidewalls, on said layer of first dielectric, wherein said top surfaces of said electrodes have a number of contact regions;
   forming a first layer of second dielectric on substrate thereby covering said electrodes;
   etching back said first layer of said second dielectric using a first etching means thereby forming first spacers of said second dielectric on said sidewalls of said electrodes;
   forming a second layer of said second dielectric on said substrate thereby covering said first spacers of said second dielectric on said sidewalls of said electrodes;
   etching back said second layer of said second dielectric using a second etching means thereby forming second spacers of said second dielectric on said first spacers of said second dielectric and removing all of said second dielectric from said top surfaces of said electrodes, wherein said second spacers formed on said first spacers have a total spacer width;
   forming a layer of third dielectric on said substrate thereby covering said electrodes, said first spacers of said second dielectric and said second spacers of said second dielectric;
   etching via holes in said layer of third dielectric using a third etching means thereby removing said third dielectric from part or all of said contact regions of said electrodes, wherein said third etching means provides an etching rate for said third dielectric at least ten times greater than the etching rate for said second dielectric; and
   filling said via holes with a second conducting material.

2. The method of claim 1, wherein said first dielectric is silicon oxide.

3. The method of claim 1 wherein said first layer of said second dielectric is a layer of silicon nitride or silicon oxynitride having a thickness of between about 300 and 3000 Angstroms.

4. The method of claim 1 wherein said second layer of said second dielectric is a layer of silicon nitride or silicon oxynitride having a thickness of between about 300 and 3000 Angstroms.

5. The method of claim 1 wherein said layer of said third dielectric is a layer of silicon oxide having a thickness of between about 6000 and 25,000 Angstroms.

6. The method of claim 1 wherein said total spacer width is between about 0.1 and 0.35 micrometers.

7. The method of claim 1 wherein said first etching means uses dry anisotropic etching with $CHF_3$, $CF_4$, $SF_6$, Ar, or $N_2$ as an etchant.

8. The method of claim 1 wherein said second etching means uses dry anisotropic etching with $CHF_3$, $CF_4$, $SF_6$, Ar, or $N_2$ as an etchant.

9. The method of claim 1 wherein said third etching means uses dry anisotropic etching with $CHF_3$, $CF_4$, Ar, or $N_2$ as an etchant.

10. The method of claim 1 wherein said substrate is an integrated circuit wafer having devices formed therein.

11. A method of forming via connections, comprising the steps of:
    providing a substrate having a layer of first dielectric formed thereon;
    forming a layer of first conductor material on said layer of first dielectric;
    forming a layer of second dielectric on said layer of first conductor material;
    etching an electrode pattern in said layer of first conducting material and said layer of second dielectric using a first etching means thereby forming electrodes of said first conductor material, each of said electrodes having a top surface and a second dielectric cap on said top surface of said electrodes, wherein said top surfaces of said electrodes have a number of contact regions;
    forming a layer of third dielectric on said substrate, wherein said layer of third dielectric covers said electrodes and said second dielectric caps;
    forming a layer of fourth dielectric on said substrate covering said layer of said third dielectric;
    etching via holes in said layer of said fourth dielectric using a second etching means wherein said second etching means provides an etching rate for said fourth dielectric at least ten times greater than the etching rate for said third dielectric;
    etching said via holes in said layer of said third dielectric using a third etching means wherein said third etching means provides an etching rate for said third dielectric at least ten times greater than the etching rake for either said second dielectric or said fourth dielectric;
    etching via holes in said second dielectric caps using a fourth etching means thereby removing all of said second dielectric from part or all of said contact regions of said electrodes, wherein said fourth etching means provides an etching rate for said second dielectric at least ten times greater than the etching rate for said third dielectric; and
    filling said via holes with a second conducting material.

12. The method of claim 11, wherein said first dielectric is silicon oxide.

13. The method of claim 11 wherein said layer of second dielectric is a layer of silicon oxide having a thickness of between about 300 and 2000 Angstroms.

14. The method of claim 11 wherein said layer of third dielectric is a layer of silicon nitride or silicon oxynitride having a thickness of between about 300 and 3000 Angstroms.

15. The method of claim 11 wherein said layer of fourth dielectric is a layer of silicon oxide having a thickness of between about 6000 and 25,000 Angstroms.

16. The method of claim 11 wherein said second etching means uses dry anisotropic etching with $CHF_3$, $CF_4$, Ar, or $N_2$ as an etchant.

17. The method of claim 11 wherein said third etching means uses dry anisotropic etching with $CHF_3$, $CF_4$, Ar, $SF_6$, or $N_2$ as an etchant.

18. The method of claim 11 wherein said fourth etching means uses dry anisotropic etching with $CHF_3$, $CF_4$, Ar, or $N_2$ as an etchant.

19. The method of claim 11 wherein said substrate is an integrated circuit wafer having devices formed therein.

* * * * *